US011073160B2

(12) United States Patent
Murugan et al.

(10) Patent No.: US 11,073,160 B2
(45) Date of Patent: Jul. 27, 2021

(54) ADAPTABLE ARTICULATING AXIAL-FLOW COMPRESSOR/TURBINE ROTOR BLADE

(71) Applicant: U.S. Army Research Laboratory ATTN: RDRL-LOC-I, Adelphi, MD (US)

(72) Inventors: Muthuvel Murugan, Abingdon, MD (US); Anindya Ghoshal, Phoenix, MD (US); Luis Bravo, Bel Air, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 282 days.

(21) Appl. No.: 15/691,858

(22) Filed: Aug. 31, 2017

(65) Prior Publication Data
US 2018/0066671 A1  Mar. 8, 2018

Related U.S. Application Data

(60) Provisional application No. 62/385,132, filed on Sep. 8, 2016.

(51) Int. Cl.
F04D 29/32  (2006.01)
F04D 27/02  (2006.01)
(Continued)

(52) U.S. Cl.
CPC ............. F04D 29/323 (2013.01); F01D 7/00 (2013.01); F04D 27/0246 (2013.01);
(Continued)

(58) Field of Classification Search
CPC .......... F01D 17/02; F01D 17/162; F01D 7/00; F05D 2260/75; F05D 2260/76;
(Continued)

(56) References Cited

U.S. PATENT DOCUMENTS 3,870,434 A   3/1975  Paulson
4,047,840 A   9/1977  Ravenhall et al.
(Continued)

OTHER PUBLICATIONS

Ainley, D.G., and Mathieson, G.C.R., "An Examination of the Flow and Pressure Losses in Blade Rows of Axial-Flow Turbines", ARC Technical Report, R&M No. 2891, Aeronautical Research Council report, 1955.

(Continued)

Primary Examiner — J. Todd Newton
Assistant Examiner — Eric J Zamora Alvarez
(74) Attorney, Agent, or Firm — Eric B. Compton

(57) ABSTRACT

Conventional gas turbine engines are generally optimized to operate at nearly a fixed speed with fixed blade geometries for the design operating condition. When the operating condition of the engine changes, the flow incidence angles may not be optimum with the blade geometries resulting in reduced off-design performance. By contrast, according to embodiments of the present invention, articulating the pitch angle of turbine blades in coordination with adjustable nozzle vanes improves performance by maintaining flow incidence angles within the optimum range at all operating conditions of a gas turbine engine. Maintaining flow incidence angles within the optimum range can prevent the likelihood of flow separation in the blade passage and also reduce the thermal stresses developed due to aerothermal loads for variable speed gas turbine applications.

20 Claims, 15 Drawing Sheets

(51) Int. Cl.
    *F01D 7/00*     (2006.01)
    *F04D 29/56*     (2006.01)
    *F04D 29/36*     (2006.01)
    *G06F 17/13*     (2006.01)
    *G06F 17/12*     (2006.01)
    *G06F 30/23*     (2020.01)

(52) U.S. Cl.
    CPC ............ *G06F 17/13* (2013.01); *F04D 29/362* (2013.01); *F04D 29/563* (2013.01); *F05D 2260/74* (2013.01); *F05D 2260/76* (2013.01); *G06F 17/12* (2013.01); *G06F 30/23* (2020.01); *Y02T 50/60* (2013.01)

(58) Field of Classification Search
    CPC ............ F05D 2260/74; F04D 27/002; F04D 27/0246; F04D 29/563; F04D 29/323; F04D 29/362; G06F 17/13; G06F 17/12; G06F 17/5018
    See application file for complete search history.

(56) References Cited

U.S. PATENT DOCUMENTS

| | | | | |
|---|---|---|---|---|
| 4,657,484 | A * | 4/1987 | Wakeman | B64C 11/306 415/130 |
| 4,772,180 | A * | 9/1988 | Walker | B64C 11/306 416/25 |
| 4,792,277 | A | 12/1988 | Dittberner, Jr. et al. | |
| 4,934,140 | A * | 6/1990 | Dennison | F02C 7/20 60/226.1 |
| 4,968,217 | A * | 11/1990 | Newton | B64C 11/32 416/147 |
| 5,154,372 | A * | 10/1992 | Hora | F01D 1/24 244/62 |
| 6,473,705 | B1 * | 10/2002 | Conners | G01F 1/661 250/343 |
| 6,767,187 | B2 * | 7/2004 | Franchet | F04D 29/362 416/157 R |
| 6,769,873 | B2 | 8/2004 | Beauchamp et al. | |
| 6,991,426 | B2 | 1/2006 | Pietricola | |
| 7,901,185 | B2 | 3/2011 | Suciu et al. | |
| 10,060,285 | B2 * | 8/2018 | Do | F01D 17/02 |
| 2005/0150223 | A1 * | 7/2005 | Rey | F03G 7/065 60/527 |
| 2011/0217170 | A1 | 9/2011 | Buffone | |
| 2012/0134783 | A1 * | 5/2012 | Davidson | F04D 27/0246 415/148 |
| 2012/0275912 | A1 | 11/2012 | Moniz et al. | |
| 2014/0140807 | A1 * | 5/2014 | Gumpina | F01D 5/225 415/1 |
| 2017/0292400 | A1 * | 10/2017 | Bifulco | F04D 27/0246 |

OTHER PUBLICATIONS

Hughes, T. J.R., Liu, W.K. and Zimmerman, T.K., "Langrangian-Eulerian Finite Element Formulation for Incompressible Viscous Flows," Computer Methods in Applied Mechanics and Engineering, 1981, 29(3), pp. 329-349.

Brooks, A.N. and T. Hughes, T. J.R., "Streamline Upwind/Petrov-Galerkin Formulations for Convention Dominated Flows with Particular Emphasis on the Incompressible Navier-Stokes Equations," Computer Methods in Applied Mechanics and Engineer, 32(1) 1982, pp. 199-259.

Bazilevs, Y. and Hughes, T. J.R., "Weak Imposition of Dirichlet Boundary Conditions in Fluid Mechanics," Computers and Fluids, 2007, 36(1), pp. 12-26.

Boyce, M.P., "Gas Turbine Engineering Handbook", Elsevier, 2011, Eqns. 3-44 and 3-45.

M. Karpelson, et al., "A review of Actuation and Power Electronics Options for Flapping-Wing Robotics Insects," 2008 IEEE International Conference on Robotics and Automation, Pasadena, CA, USA May 19-23, 2008.

Hsu, M.-C and Bazilevs, Y., "Fluid-Structure Interaction Modeling of Wind Turbines: Simulating the Full Machine," Computational Mechanics, 2012, 50(6), pp. 821-833.

M.-C. Hsu, et al, "An Interactive Geometry Modeling and Parametric Design Platform for Isogeometric Analysis," Computer and Mathematics with Application, 70(7), 2015, pp. 1481-1500.

M. Murugan, et al, "Adaptable Gas Turbine Blade Concept Study," Presented at the AHS 71st Annual Forum, Virginia Beach, Virginia, May 5-7, 2015.

M. Murugan, et al., "Concept Study for Adaptive Gas Turbine Rotor Blade," International Journal of Engineering and Science (IJES), vol. 4, Issue 9, pp. 10-15, 2015, ISSN (e): 2319-1813 ISSN (p): 2319-1805.

M. Murugan et al., Slide Presentation titled "Fluid-Structure Simulation Study on Conceptual Adaptive Turbine Blades or Improved Off-Design Performance of Gas Turbine Engines," TETS 2016—Turbine Engine Technology Symposium Dayton, Ohio, Sep. 12-15, 2016.

M. Murugan, et al., "Articulating Turbinerotor Blade Concept for Improved Off-Design Performance of Gas Turbine Engines," ASME 2016 Conference on Smart Materials, Adaptive Structures and Intelligent Systems SMASIS2016, SMASIS2016-9045, Sep. 28-30, 2016, Stowe, Vermont, USA.

Wikipedia entry for "CFM International CFM56." Available at: https://en.wikipedia.org/wiki/CFM_International_CFM56 (page last edited Aug. 25, 2020).

Wikipedia entry for "Engine_Alliance_GP7000." Available at: https://en.wikipedia.org/wiki/Engine_Alliance_GP7000 (page last edited Jun. 12, 2020).

Sunil Sinha, "Rotordynamic analysis of asymmetric turbofan rotor due to fan blade-loss event with contact-impact rub loads," Journal of Sound and Vibration, Elsevier, 2013, 332 (9), pp. 2253-2283.

* cited by examiner

The rotor and stator blades at 0°

Pitching the rotor and stator blades both by 15°

(a) Before pitching  (b) After pitching (a) Before pitching (b) After pitching

Mach number based on absolute velocity

Before pitching:

After pitching the rotor blades by 5° counter-clockwise:

SMA tubes with linkage mechanisms for synchronous articulation of blades

ADAPTABLE ARTICULATING AXIAL-FLOW COMPRESSOR/TURBINE ROTOR BLADE

CROSS-REFERENCE TO RELATED APPLICATION(S)

This application claims the benefit of U.S. Provisional Patent Application No. 62/385,132 filed on Sep. 8, 2016, the disclosure of which is herein incorporated by reference in its entirety for all purposes.

STATEMENT OF GOVERNMENT INTEREST

The invention described herein may be manufactured, used, and licensed by or for the United States Government without the payment of royalties.

BACKGROUND OF THE INVENTION

Field

This application generally relates to rotor blades, and in particular to, adaptable articulating rotor blades used in compressors and turbines.

Background

Gas turbine blades of conventional rotorcraft turboshaft engines, such as depicted in FIG. 1, are optimized to operate at nearly a fixed speed and a fixed incidence angle. If the operating condition of the engine changes, then the flow through the turbine may need to be guided to a more optimum direction. One smart way to accomplish this is to use variable turbine nozzle geometry, which has been traditionally used to change the angle of attack of non-rotating stator vanes to optimize the aerodynamic performance and efficiency of the turbine over a given operating range. By rotating the vanes, the incidence angle and the effective throat area can be reduced or increased to optimize the flow velocity for a range of varying flight operating conditions. However, this traditional method has some disadvantages, such as, increased weight and complexity, and also limited operating range, since the nozzle vanes can only be turned to a certain amount before severe flow incidence angles begin to affect the rotating blades downstream.

Another method to increase the operating range of turbine engines is to design a blade that is "incidence tolerant" of the incoming flow angles. Incidence tolerant blade research has been conducted by NASA Glenn Research Center (NASA-GRC) and the U.S. Army Research Laboratory (ARL) as a potential solution for maintaining turbine blade aerodynamic performance for a variable speed power turbine. Variable speed power turbines (VSPT) are a potential enabling technology for high speed tilt rotorcraft, where the power turbine speed needs to be slowed down by as much as 51% during cruise flight compared to hover flight for improved performance. There are significant design challenges for turbine blades operating over such speed ranges due to the turbine blades experiencing a wide range of incidence angles and Reynolds numbers. Slowing down the power turbine significantly will need higher work factors (flow turning) and will result in lower efficiencies as compared to a turbine optimized for nearly constant high speed (100%) operation. For vertical lift air vehicles, maintaining high fuel efficiency is a challenge and a balance must be achieved with the fuel burn penalties associated with variable speed engine capability, and the gains achieved by slowing the main rotor speed substantially (to 51%) of take-off speed as required to maintain high propeller efficiencies at cruise flight speed.

BRIEF SUMMARY OF THE INVENTION

Embodiments of the present invention provide an adaptable articulating blade assembly which includes a suitable actuation mechanism with adequate actuation force and control authority for rotation of blade elements. The embodiments have applicability to variable speed gas turbine engines for improved performance. The actuation device can be built of hydro-mechanical mechanism or pneumatic-mechanical mechanism or electro-mechanical mechanism or MEMS (Microelectromechanical systems) based/piezoelectric material based mechanism or magnetic/electro-magnetic material based mechanism or Shape Memory Alloy (SMA) smart material based mechanism, as examples. The inner portion of the blade airfoil base mating with turbine rotor disk (turbine blisk) is housed with suitable actuation device that is used to rotate or change the pitch angle of each individual rotor blade from its base. The blade rotation is performed about a point close to the leading edge of the blade. This rotation changes the geometry of the blade angle with respect to the incoming flow incidence angle.

By pitching the rotor blades in coordination with the adjustable blades (e.g., stator nozzle vanes), the flow incidence angles can be maintained within the optimum range for improved aerodynamic performance. Potential benefits to future military and commercial aviation gas turbine engines are highly, aerodynamically efficient turbine blades, reduced noise and vibration, possible reduction of the need for active blade cooling and thermal barrier coatings, increased fuel efficiency, power density, and the ability to fly faster and longer.

These and other embodiments of the invention are described in more detail, below.

BRIEF DESCRIPTION OF THE DRAWINGS

The foregoing and other objects, features, and advantages of the invention will be apparent from the following more detailed description of non-limiting embodiments of the invention, as illustrated in the accompanying drawings, wherein:

FIGS. 7(a)-(c) show the Rhinoceros-Grasshopper parametric design tool for adaptive turbine blades used by the inventors, in which FIG. 7(a) depicts the parametric design tool in Grasshopper, FIG. 7(b) shows the rotor and stator blades at 0°, and FIG. 7(c) shows pitching the rotor and stator blades both by 15°;

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DETAILED DESCRIPTION OF EMBODIMENTS OF THE INVENTION

While the previous approaches of incorporating variable stator nozzle vane geometry and incidence tolerant blading can increase the operating range of a turbine to some extent, further optimization and performance improvements could be achieved by articulating the rotating blades of the turbine in coordination with stator nozzle vanes. We have explored an alternative to incidence tolerant blade design by articulating the pitch angle of rotating gas turbine blades and stator vanes for variable speed applications to always maintain incidence angles optimized for maximum aerodynamic performance. Future studies will include the possibility of morphing the blade shape in a high temperature/high pressure environment. Herein, we discuss stator-rotor interaction analysis that we conducted on articulating high pressure turbine blades and stator vanes synchronously with the goal of achieving improved aerodynamic efficiency over a wide range of off-design operating conditions. In essence, it is postulated that the compressor blades, gas generator turbine stator and rotor blades and the power turbine stator/rotor blades, will benefit from the articulating blade technology concept in terms of optimized aerodynamic performance, reduced thermal stresses, widened engine stall margin and reduction of flow losses, and higher energy conversion (power turbine) at a wide range of operating conditions.

NOMENCLATURE

Figure 1:
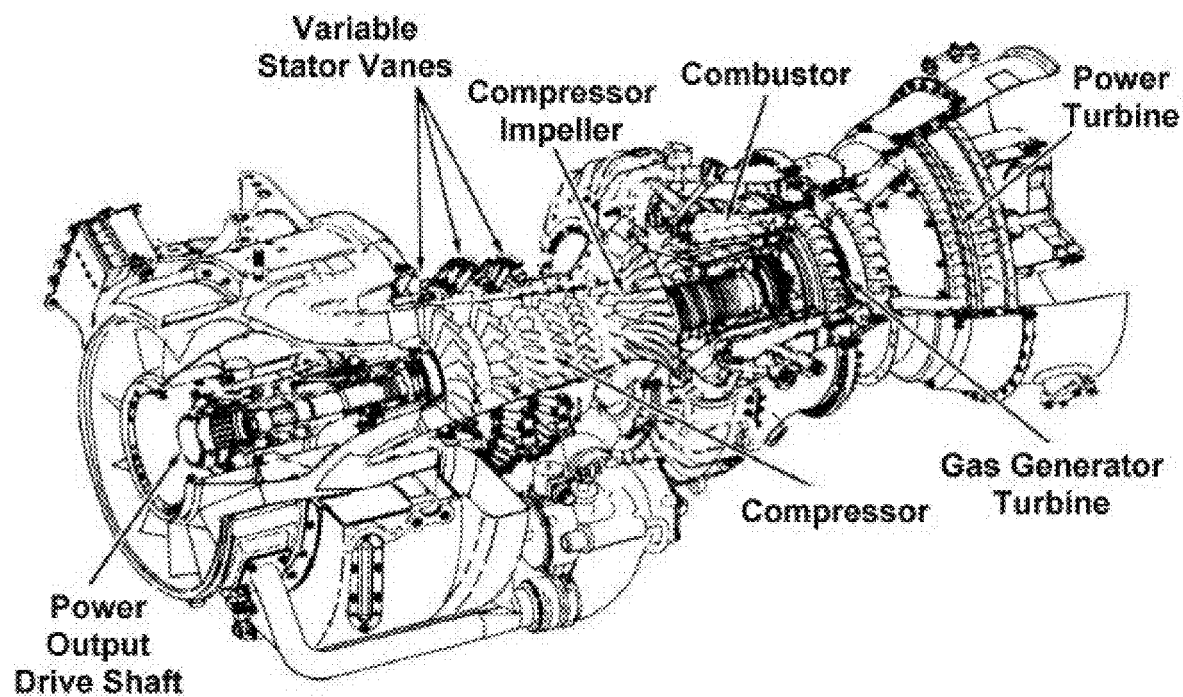
FIG. 1 illustrates a cut-away view of a conventional rotorcraft gas turbine engine.

The following terms and acronyms are used herein:

α: Absolute flow angle with respect to axial direction
β: Relative flow angle with respect to axial direction
C: Absolute flow velocity
$C_a$: Axial component flow velocity
CFD: Computational fluid dynamics
NiTi: Nickel-Titanium shape memory alloy
Re: Reynolds number
SHP: Shaft horse power
SMA: Shape Memory Alloy
U: Blade tangential velocity
V: Resultant flow velocity Blade Mechanisms For illustration purposes, FIG. 1 shows a typical stator and rotor blade flow passages for an axial flow turbine stage in a turbine engine. The T-700 manufactured by General Electric is an example of a conventional turbine engine. The blade shapes shown are for reference only. In gas turbine engines, the stator and rotor blade rows are close together; typically the gap is approximately 20% of the blade chord.

Figure 2:
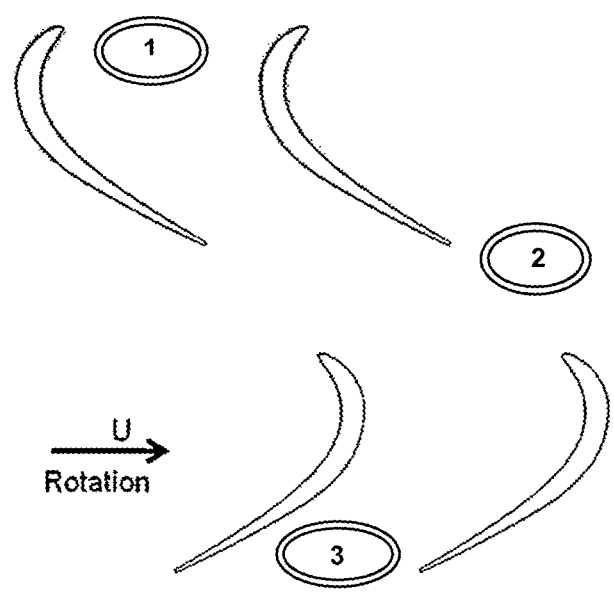
FIG. 2 is a conceptual sketch of turbine stator and rotor passages in a gas turbine engine.
Figure 3:
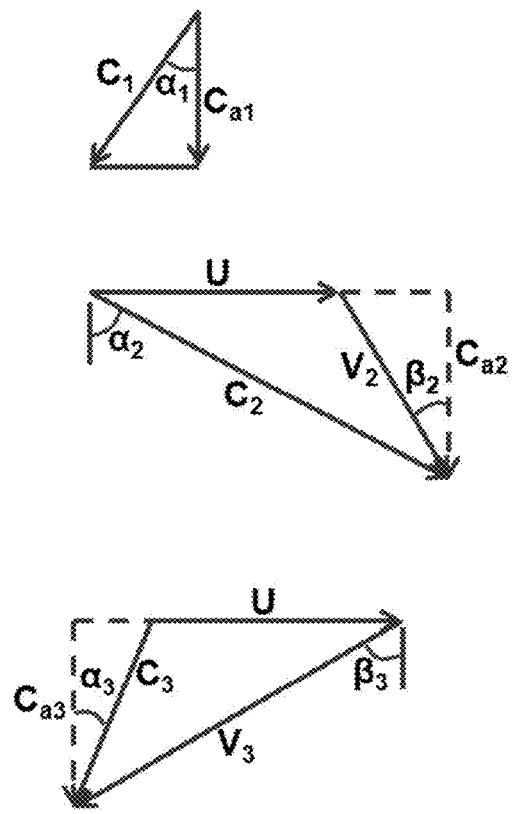
FIG. 3 illustrates flow velocity triangles through stator and rotor blade passages for axial flow turbine stage (design condition)

For the cascade arrangement shown in FIG. 2, the corresponding flow velocity triangles are shown in FIG. 3 for a conceptual design condition (100% gas turbine speed). For both rotor and stator rows the flow is nearly tangential at outlet than at inlet. In FIG. 3, $C_1$ corresponds to absolute flow velocity at inlet to the turbine stator or nozzle. The stator inlet blade angle is denoted as $α_1$. $C_{a1}$ is the axial component of flow velocity at inlet to the stator. U denotes the tangential velocity of the rotor blade. $V_2$ denotes the relative flow velocity at inlet to the blade passage. $β_2$ is the inlet rotor blade angle with respect to axial direction as shown in FIG. 3. $C_2$ is the absolute flow velocity at rotor blade inlet. $α_2$ is the absolute flow angle with respect to axial direction at inlet to rotor blade passage. Similar notations apply to the flow velocity triangle at the rotor blade passage exit noted with suffix 3. One example of wide variation for engine speed/torque would be a power turbine for a tilt rotor aircraft. If the engine condition changes, say from take-off (100% power turbine speed) to cruise (50% power turbine speed) for a tilt-rotor vehicle, the incidence flow angles will change.

Figure 4:
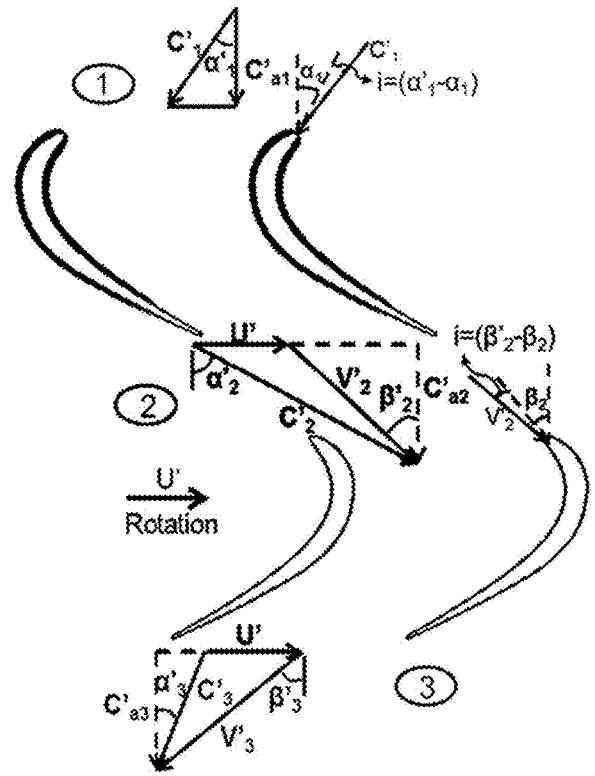
FIG. 4 illustrates flow velocity triangles through stator and rotor blade passages for axial flow turbine stage (off-design condition)
Figure 5:
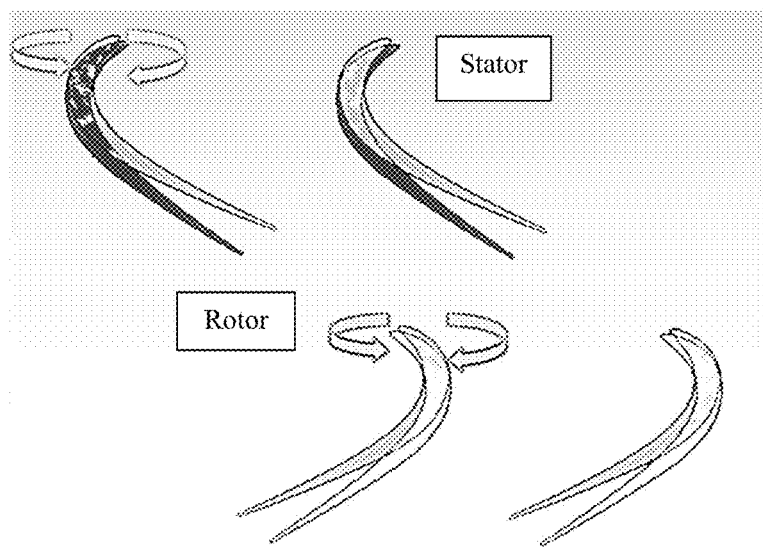
FIG. 5 shows coordinated articulation of stator and rotor blades for efficient aerodynamic performance.

For a chosen off-design condition, the resulting flow velocity triangles and blade angles for reduced gas turbine speed are shown in FIG. 4 conceptually. In FIG. 4, the changed flow velocities C', U' and V' and inlet fluid flow angles $α'_1$, $β'_2$ and $α'_2$ are shown for the stator and rotor blade passages altered with respect to an incidence angle, i, which is defined as the inlet fluid flow angle minus the blade angle. Since the vane and blade angles remain the same in conventional design in current gas turbine engines, the performance of the turbine would decrease due to high incidence angles and resulting flow separation losses. But if both vanes and blades were allowed to articulate to change their respective pitch angles, as shown conceptually in FIG. 5, aerodynamic losses would be minimized, and turbine performance would remain optimum at all operating conditions.

By articulating both stator and rotor blades synchronously, we can establish optimal well-attached flow to maximize aerodynamic performance at various stator and rotor flow angle variations under different operating conditions. Currently, the research team is studying candidate designs concepts for blade articulation mechanisms. Promising candidate designs will then be down-selected for future efforts on this research.

Figure 6:
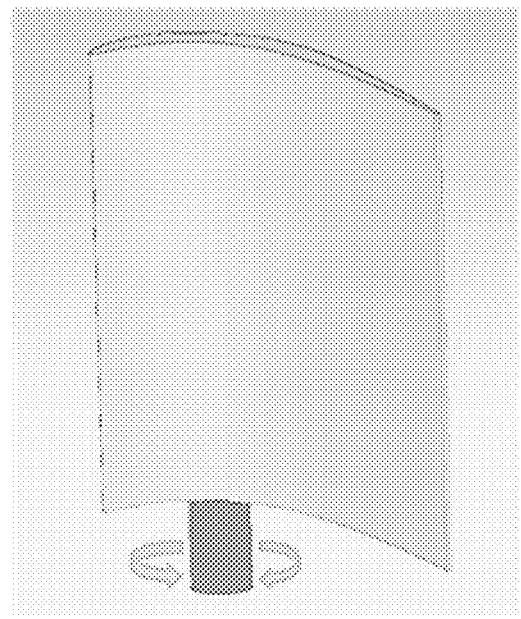
FIG. 6 depicts a blade pitch articulation using a high temperature capable SMA.

FIG. 6 shows an example of the airfoil and shape memory alloy (SMA) torque-tube for articulating the blade. This blade articulating mechanism was disclosed in a paper by M. Murugan, et al, titled "Adaptable Gas Turbine Blade Concept Study," that was presented at the AHS 71st Annual Forum, Virginia Beach, Va., May 5-7, 2015.

This is not a shaft that rotates the turbine disk consisting of airfoil blades. The SMA torque-tube is attached to the base of the airfoil, and is used to articulate the blade for example, about +x and/or −y deg (not full rotation) (the values of x and y can be determined through performance optimization for a given design). In some cases, x=y. The SMA torque-tube and location of attachment to the blade shown in FIG. 6 are depicted to explain the concept.

According to various embodiments of the present invention, the SMA torque tube (or other actuator) may be attached to base of the airfoil blade either through a set of gears or directly to aid articulation of the blade about the blade's vertical axis (to help change the angle of incidence of the flow with respect to the blade geometric angle).

Smart Materials Based Actuation Systems

There exists several smart actuation mechanisms, such as piezoelectric, Shape Memory Alloy (SMA), magnetic, and electrostatic that have been used successfully in micro electromechanical systems (MEMS), and may be applicable for micro-turbines. Pneumatic, hydraulic, electromechanical, magnetic, smart materials like SMAs, and piezoelectric materials should be considered when trying to determine the best mechanism for use in an articulating blade technology. The packaging sizes, weight/power penalties, and design complexities are the key considerations while selecting the best actuator types for blade articulation mechanisms. However, the main disadvantage to all of the potential actuation mechanisms is that none can be used at high temperature and pressure, which is present in a gas turbine engine environment. The design constraint for the system needs to have minimal form factor and weight. The current design is to house the system at the hub or disk of the rotating blade.

In order to determine the best mechanism that can be used in an articulating blade, several factors need to be considered, such as output power density, efficiency, actuation force density, and integration with the system. M. Karpelson, et al., "A review of Actuation and Power Electronics Options for Flapping-Wing Robotics Insects," 2008 IEEE International Conference on Robotics and Automation, Pasadena, Calif., USA May 19-23, 2008, is a good reference comparing some of these actuator attributes.

According to embodiments, we provide an articulating blade assembly which articulates the pitch angle of the stator and/or rotating turbine blades synchronously. The embodiments can house one or more actuators inside the turbine disk for rotor blade and on the outer engine casing for stator vanes. Benefits from this construction include a radially lower placement of weight from the actuation mechanism and lower temperatures than if the mechanism were placed in the blade itself. SMAs or other potentially viable smart material based actuators can be used for the blade pitch articulation application such as shown in FIG. 6 as an example. For some embodiments, the actuators can be housed inside the turbine disk from a packaging design consideration. However, the actuator will have to be constructed to survive turbine disk temperatures that could reach 700° C. and above. The advantage with this construction and packaging is that the temperature inside the turbine disk would be considerably lower than in the blade itself, allowing the possibility of using a NiTi SMA combined with Pd, Pt, Au, Hf, or Zr to sustain temperatures in the range of up to about 800° C.

Currently, there has been continued interest in developing high temperature shape memory alloys (SMA) for applications in aerospace, automotive, process and energy industries. However, the present commercially available NiTi SMA alloys are limited in their high temperature durability and sustainability characteristics. The addition of Pd, Pt, Au, Hf, and Zr to NiTi alloys have shown some potential to increase the high temperature sustainability of NiTi alloys up to approximately 800° C., but their mechanical strength characteristics at high temperatures have not been fully investigated. It has been reported that there are practical temperature limitations for ternary TiNiPd and TiNiPt alloys and the ability of these alloys to undergo repeated thermal cycling under load without significant permanent deformation.

There are considerable materials challenges that include functional and structural fatigue under repeated actuation. Transmission electron microscopy studies show the development of plasticity when SMAs are heated and cooled, even in the absence of an external load. New high-temperature Ni—Ti—Hf alloys are able to suppress this phenomenon by engineering nanoscale precipitates that suppress plasticity and yet allow the phase transformation to progress seamlessly. An understanding of these phenomena is critical to the design and application of new high temperature SMAs for gas turbine engine applications.

CFD Modeling of Stator-Rotor Interaction

Parametrical Geometry Generation

The various embodiments optimize the pitch angles of the stator and rotating blades synchronously and perform a series of simulations with different pitch angles, which requires a capability to change the blade-pitch angles parametrically. Following the idea of interactive geometry modeling platform by Hsu et al. (M.-C. Hsu, et al, "An Interactive Geometry Modeling and Parametric Design Platform for Isogeometric Analysis," Computer and Mathematics with Application, 70(7), 2015, pp. 1481-1500), we built a parametric design tool based on Rhinoceros 3D (http://www.rhino3d.com) and Grasshopper (http://www.grasshopper3d.com).

Figure 7A:
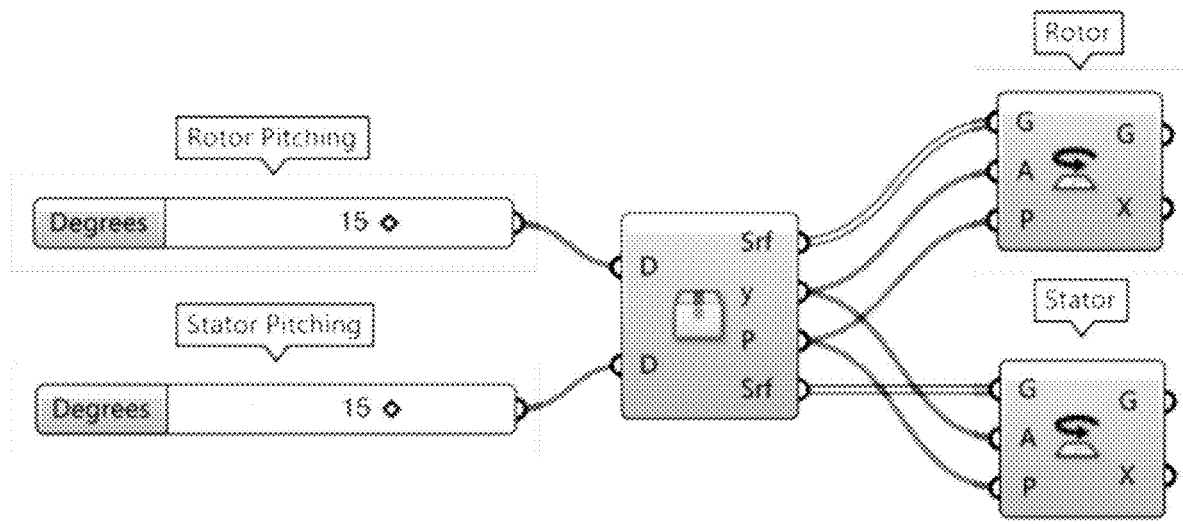
Figure 7B:
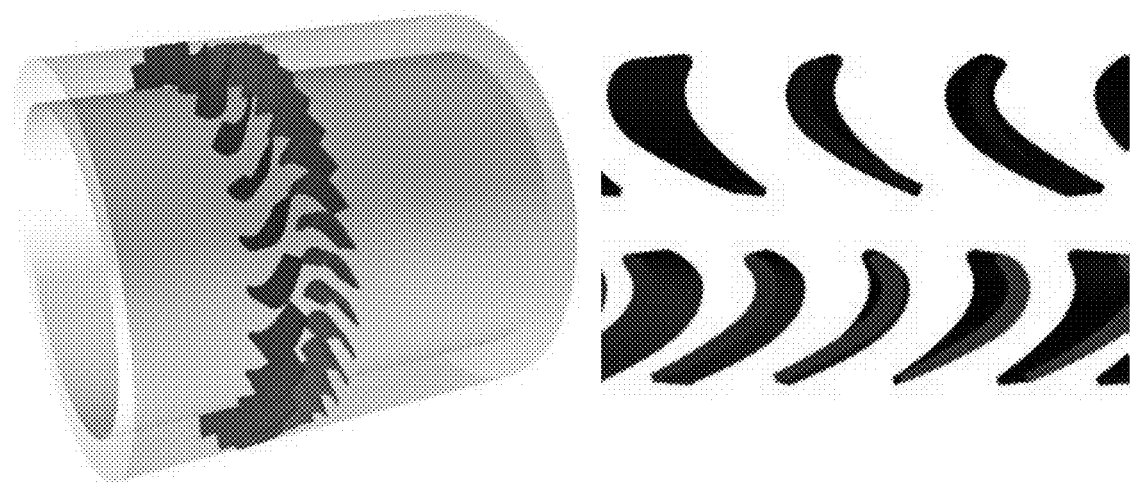
Figure 7C:
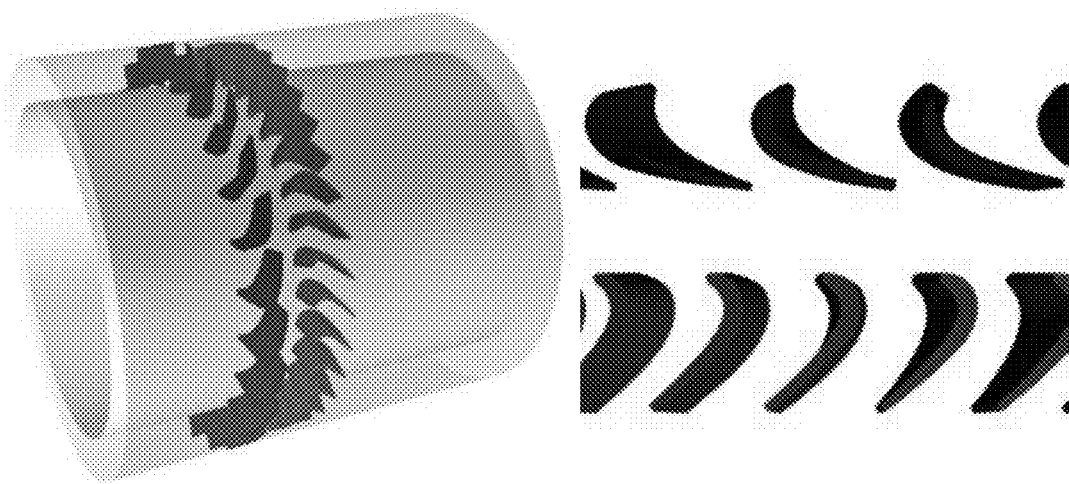

FIG. 7(a) shows a schematic of the modified Grasshopper design tool that we built. It uses two key input parameters, "Rotor Pitching" and "Stator Pitching." By changing the numbers in these two slider bars, we can directly change the pitching angle of the rotor and stator blades parametrically in our 3D model. The parameters, such as D (degrees), Srf (surface), y (rotational point on blade), P (pitch between blades—blade spacing), G (grid size), A (angle of rotation), X (minimum grid size for computational accuracy) etc., notionally shown in FIG. 7a) are determined from optimization analysis for obtaining the desired articulation angles of both the rotor and stator blades synchronously, and then used to create the grid necessary for carrying out computational fluid dynamics analysis to predict aerodynamic performance. This computational optimization tool can be developed and eventually incorporated into an engine controller that can automatically determine the desired synchronous articulation angles of stator and rotor blades to improve efficiency under changing operating conditions for a gas turbine engine. The slider bars correspond to pitch angle, such as between 0 and 20 degrees in degree (or partial degree) intervals; they are shown set at 15 degrees for both the rotor and stator pitching in this drawings. FIGS. 7(b) and 7(c) illustrate the results of pitching by changing the input parameters. From FIGS. 7(b) and 7(c), we change the pitch angle of both rotor and stator blades by 15°. The resulting geometric model is generated automatically, and is ready for mesh generation and analysis.

CFD Methodology

To perform the CFD analysis of the flow in the full annulus of the turbine stage, we use a finite-element-based formulation to solve the 3D compressible Navier-Stokes equations, $$U_j + F_{i,j}^{adv} = F_{i,j}^{diff} + S, \quad (1)$$

where U is vector of the conservation variables, $F_i^{adv}$ and $F_i^{diff}$ are the advective and diffusive flux, respectively, in ith direction, and S is the source term. Using the primitive variables, rather than conservation variable, it is possible to rewrite (1) into the quasi-linear form as:

$$A_0 Y_j + A_i Y_j = (K_{ij} Y_j)_i + S, \quad (2)$$

where $A_0 = U_y$, $A_i = F_{i,Y}^{adv}$ is the ith Euler Jacobian matrix, $K_{ij}$ is the diffusivity matrix such that, $K_{ij} Y_j = F_i^{diff}$ and the vector of primitive variables is $Y = \{p, u_1, u_2, u_3, T\}^T$.

In this work, we used Streamline Upwind/Petrov-Galerkin (SUPG) (See Brooks, A. N. and T. Hughes, T. J. R., "Streamline Upwind/Petrov-Galerkin Formulations for Convection Dominated Flows with Particular Emphasis on the Incompressible Navier-Stokes Equations," Computer Methods in Applied Mechanics and Engineering, 32(1) 1982, pp. 199-259, DOI: 10.1016/0045-7825(82)90071-8) as the core technology to numerically solve the compressible Navier-Stokes equations (2). Novel stabilization techniques based on SUPG are developed, to both better stabilize the formulation and to model the turbulence. While the Eulerian frame of reference is commonly used for CFD applications, in order to describe the flow inside the turbine passage which includes the spinning rotor and stationary stator vanes, we employed the Arbitrary Lagrangian-Eulerian (ALE) formulation for compressible flow. See Hughes, T. J. R., Liu, W. K. and Zimmerman, T. K., "Langrangian-Eulerian Finite Element Formulation for Incompressible Viscous Flows," Computer Methods in Applied Mechanics and Engineering, 1981, 29(3), pp. 329-349, DOI: 10.1016/0045-7825(81)90049-9. Furthermore, we partition the computational domain into the rotor and stator subdomains and couple them through the sliding interface, (see Hsu, M.-C and Bazilevs, Y., "Fluid-Structure Interaction Modeling of Wind Turbines: Simulating the Full Machine," Computational Mechanics, 2012, 50(6), pp. 821-833), a formulation we extended to compressible flow in the present work. Finally, weakly enforced no-slip conditions (see Bazilevs, Y. and Hughes, T. J. R., "Weak Imposition of Dirichlet Boundary Conditions in Fluid Mechanics," Computers and Fluids, 2007, 36(1), pp. 12-26) are imposed on the blade surfaces in order to avoid excessive resolution of the turbulent boundary layers.

Simulation Results and Discussion

Figure 8:
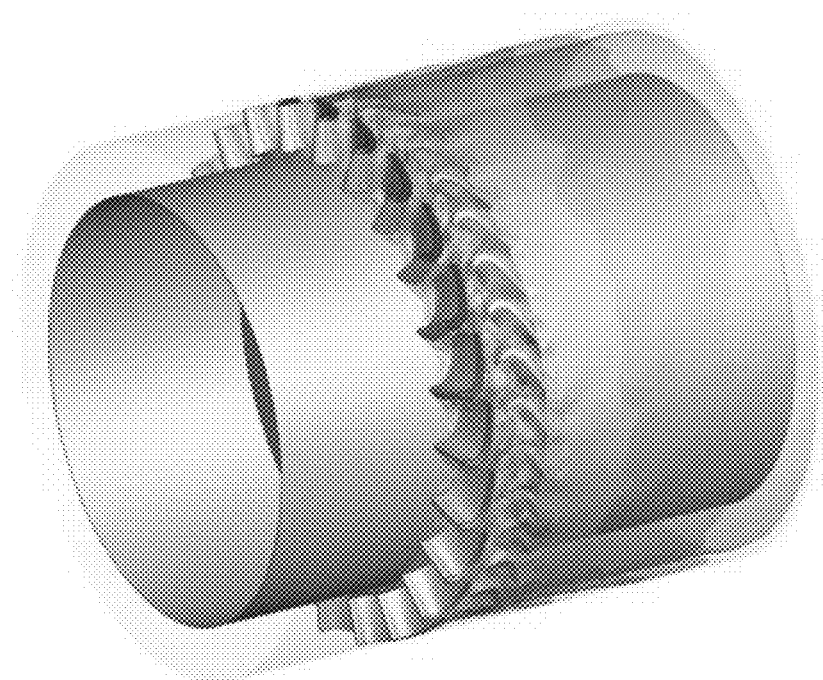
FIG. 8 shows iso-surfaces of velocity at 300 m/s, 400 m/s, and 500 m/s in a turbine stage.

One exemplary turbine stage is designed to have an axial inflow velocity of 82.3 m/s. The tangential rotating speed at the tip of rotor blades is 447.23 m/s with the blade span (or radial blade height) being 18 mm approximately. The velocity triangle follows FIG. 3, with β2 matching the blade inlet angle of rotor blades. With the adaptive turbine blade we proposed earlier, we are able to pitch the rotor blades to change the blade inlet angle to match different stator exit flow angles. The 3D flow field of flow inside the full annulus of the turbine stage is shown in FIG. 8.

We have verified the articulating blade system using CFD simulations of axial turbine stator-rotor interactions. The simulations clearly show that by matching the flow incidence angles and blade geometry through articulating blades, we can improve the aerodynamic performance and efficiency at varying operating conditions.

Figure 9:
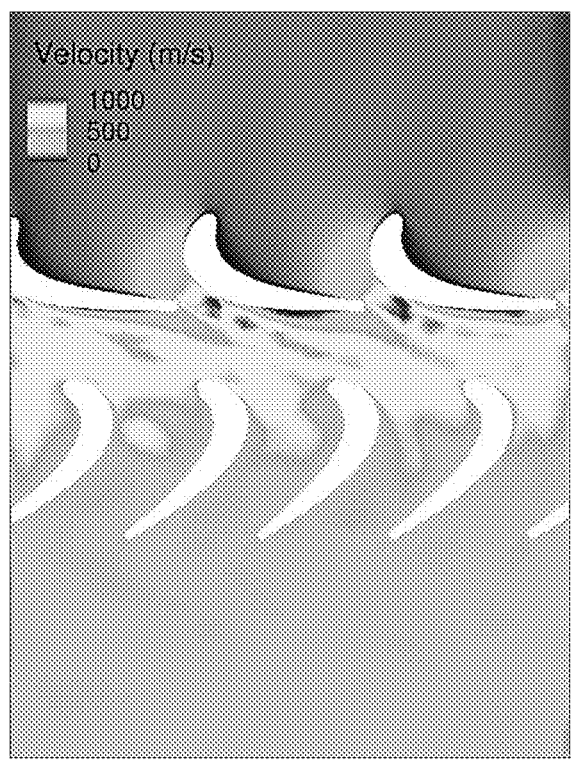
FIG. 9 shows absolute flow velocity in a turbine stage before and after pitching.
Figure 9:
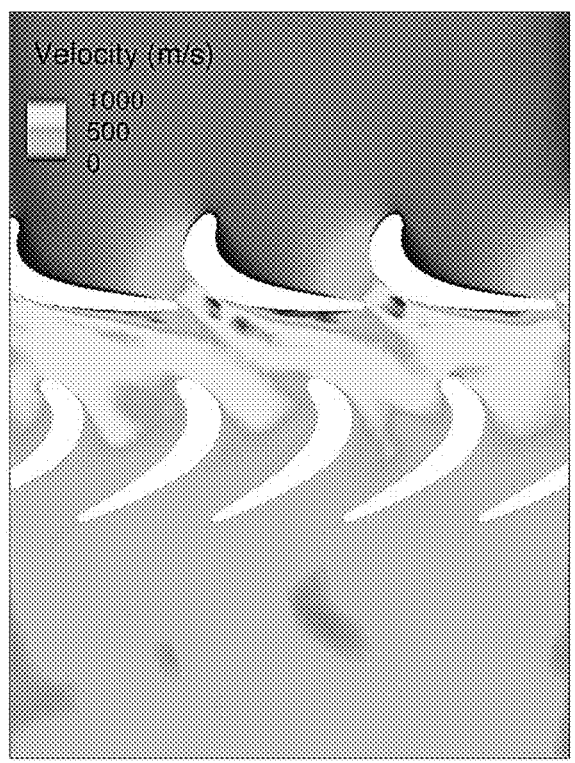

FIG. 9 shows the absolute velocity contour on a planar cut through the turbine stage. In FIG. 9(a), the inflow (stator exit flow) direction does not match the blade inlet angle of the rotor, creating a large incidence angle. As a result, we pitch the rotor blades clockwise by 10° to better match the blade inlet angle to the flow inlet angle (β2. We can clearly see that after pitching, the flow exits the rotor passages with a smaller magnitude for the case (b)—After pitching, as compared to case (a)—Before pitching, meaning that after pitching more flow momentum is converted into the rotor torque, therefore reducing the associated losses and improving the turbine performance.

Figure 10:
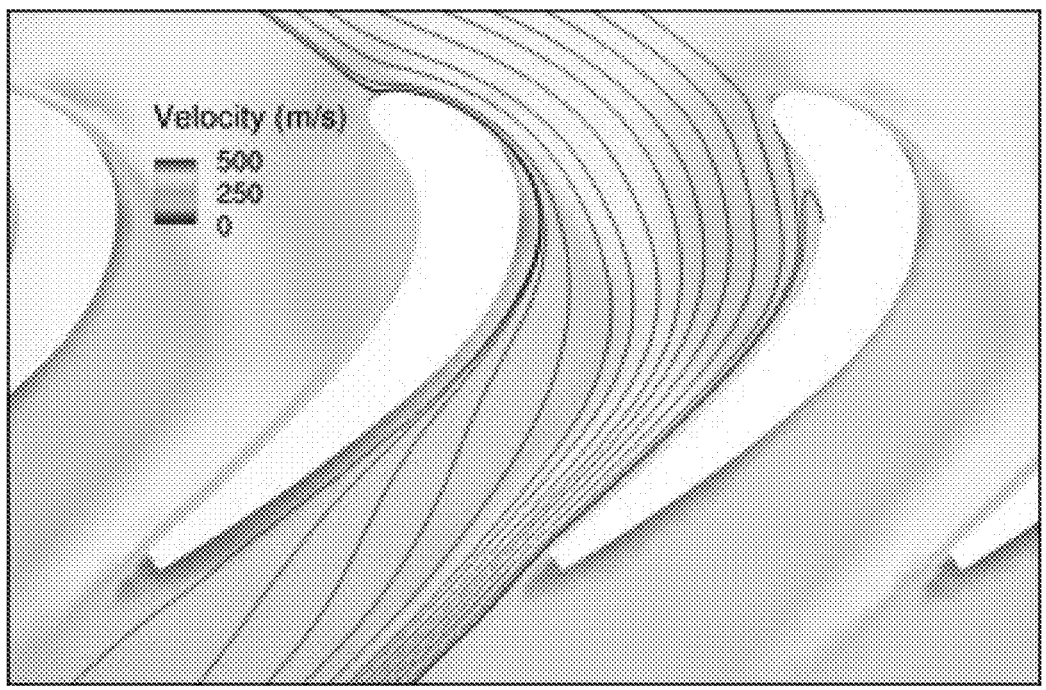
FIG. 10 shows streamlines of relative velocity in a rotor passage before and after pitching.
Figure 10:
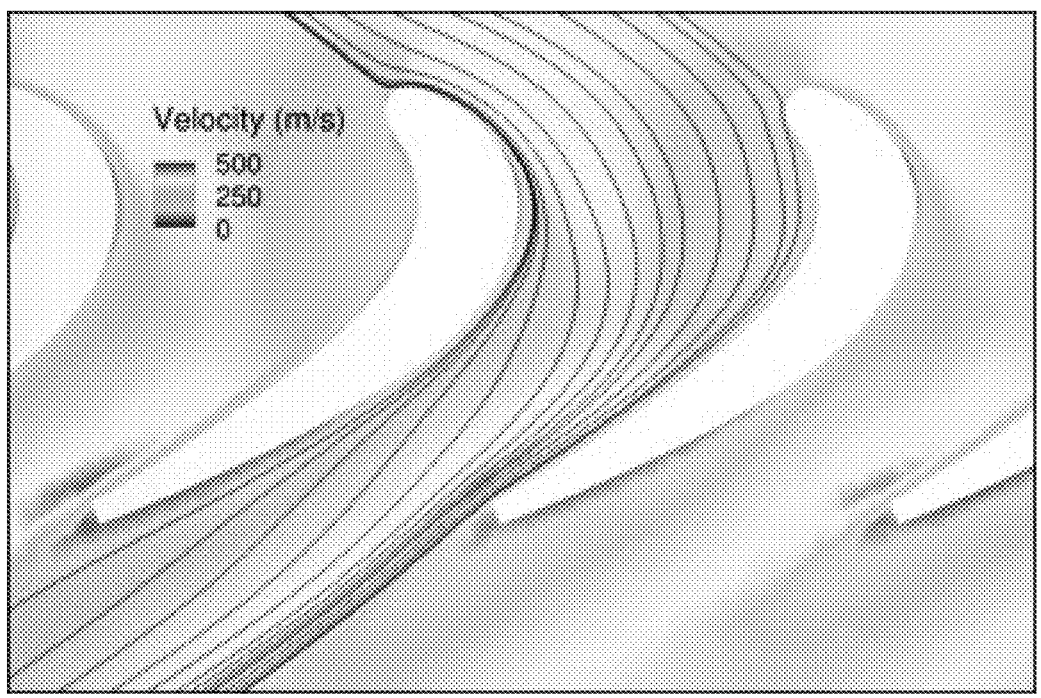

From the same simulations, we show the relative velocity field inside the rotor passages in FIG. 10. Before pitching the rotor blades, at this off-design operating condition, we can see that flow is not fully attached on the suction surface and the pressure surface, which is not the optimal flow for good aerodynamic performance (see FIG. 10(a)). By pitching the rotor, we are able to recover a more optimal flow field associated to the turbine inlet condition. The flow is fully attached to the blades, on both the pressure and suction surfaces, as shown in FIG. 10(b).

The key results from 3D CFD results of stator-rotor interaction in a turbine stage under off-design condition are provided above. The results obtained from CFD simulations confirm that by articulating the rotor blades, we are able to recover a more optimal flow field and thus can potentially achieve high performance of gas turbine under off-design conditions. Optimal performance has been shown through CFD simulations for articulating gas turbine blade passages. The degree of pitch allowable depends on the design space limitations of a given turbine blade passage geometry. Our CFD computations for a typical blade passage geometry shows about 20 deg. as the limit for the degree of pitch, which is primarily controlled by the minimum blade passage throat area possible to avoid supersonic flow conditions and associated shock waves in the blade passage.

Figure 11A:
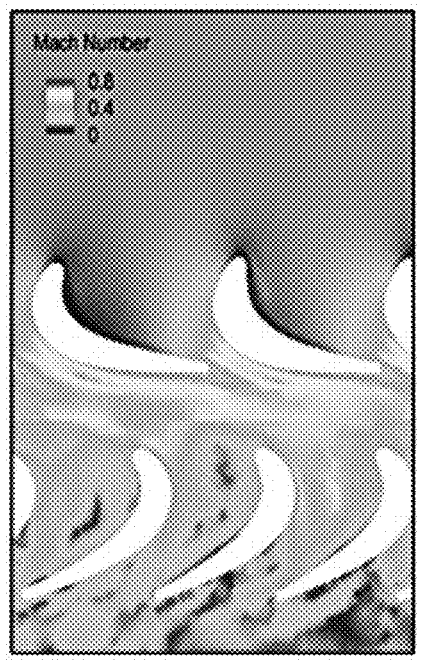
FIG. 11(a) shows Mach number contours before and after pitching.
Figure 11A:
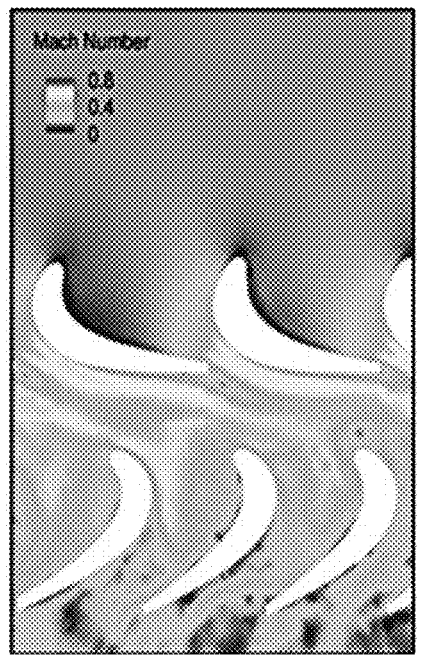
Figure 11B:
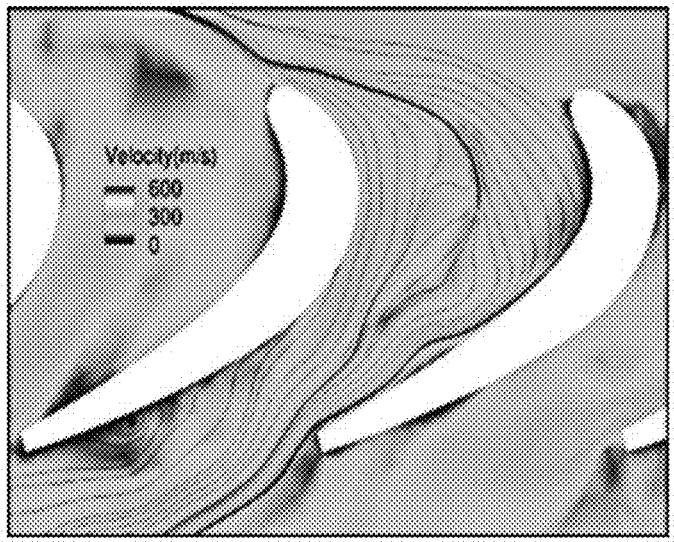
FIG. 11(b) shows relative velocity contours in rotor blade passage before and after pitching.
Figure 11B:
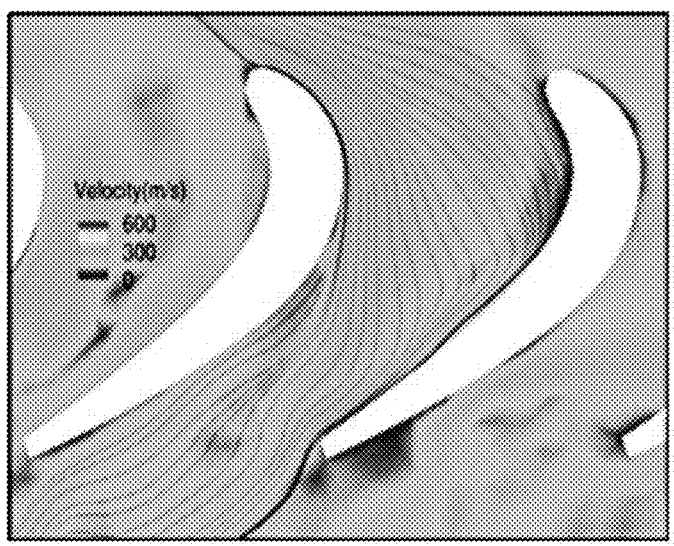

Using CFD, aerodynamic pressure losses were calculated for two cases: (1) Before pitching off-design condition, and (2) after pitching the rotor blades by 5 deg. FIGS. 11(a) and 11(b) show the flow field computations in a turbine stage (stator and rotor passages).

It is well-known that the pressure loss in the gas turbine blade passage occurs due to skin friction, separation, non-uniformity of three-dimensional flow, tip clearance, etc. Reducing the pressure loss by enabling improved blade passage aerodynamics without flow separation and/or local vortices will help to enhance gas turbine engine performance.

Pressure loss are referred to in terms of a loss coefficient $Y_t$, defined as in Ainley, D. G., and Mathieson, G. C. R., "An Examination of the Flow and Pressure Losses in Blade Rows of Axial-Flow Turbines", ARC Technical Report, R&M No. 2891, Aeronautical Research Council report, 1955, as follows:

$$Y_t = \frac{p_{t0} - p_{t2}}{p_{t2} - p_{s2}} \quad (3)$$

where $p_t$ is the total pressure, $p_s$ is the static pressure. Subscripts 0-2 refer to the locations shown in the FIG. 12. From the above CFD simulations and Equation (3), the pressure loss coefficients were computed as given below:

Before pitching: $Y_t=0.4642$

After pitching: $Y_t=0.4391$

We see an improvement in pressure loss coefficient by 5%, which is a significant improvement for gas turbine engines and will enable increased efficiency for the turbine stage at this operating condition.

Figure 12:
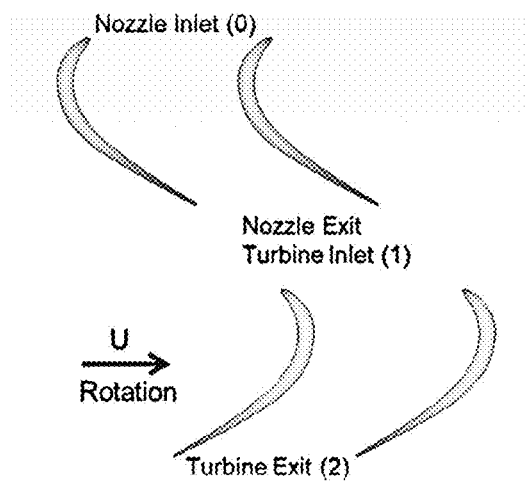
FIG. 12 is a sketch of turbine stator and rotor passage for subscript notations.

In addition, gas turbine performance can be assessed by computing the adiabatic efficiency of the turbine stage. The adiabatic efficiency is defined as the ratio between the actual and isentropic (ideal) power output. With subscripts 0 and 2 denoting quantities at the stator inlet and rotor exit, respectively, as shown in FIG. 12, the adiabatic efficiency, $\eta_{ad}$ is given by the equation as shown below (Reference: Boyce, M. P., "Gas Turbine Engineering Handbook", Elsevier, 2011).

$$\eta_{ad} = \frac{1 - \frac{T_2}{T_0}}{1 - \left(\frac{P_2}{P_0}\right)^{\frac{\gamma-1}{\gamma}}} \quad \left[\eta_{ad} = \frac{\text{Actual work}}{\text{Isentropic work}}\right] \quad (4)$$

where $\gamma$ is the specific heat capacity ratio of air. Using the above formula in the post-processing of our simulation results from the newly developed finite-element based FSI code, we find that before pitching $\eta_{ad}=0.468$, while after pitching $\eta_{ad}=0.494$, which presents a 5% increase in stage efficiency. This shows that turbine blade pitching can help improve gas turbine efficiency under off-design conditions significantly. In order to optimize the aerodynamic efficiency, it is envisaged to use an inlet flow velocity sensor (flow direction & magnitude) to determine the inflow incidence angle and the blade will be articulated accordingly using a feedback control algorithm to set the blade at the optimum orientation for the best aerodynamic performance for each changing operating condition.

Blade Articulation Mechanisms

Figure 13:
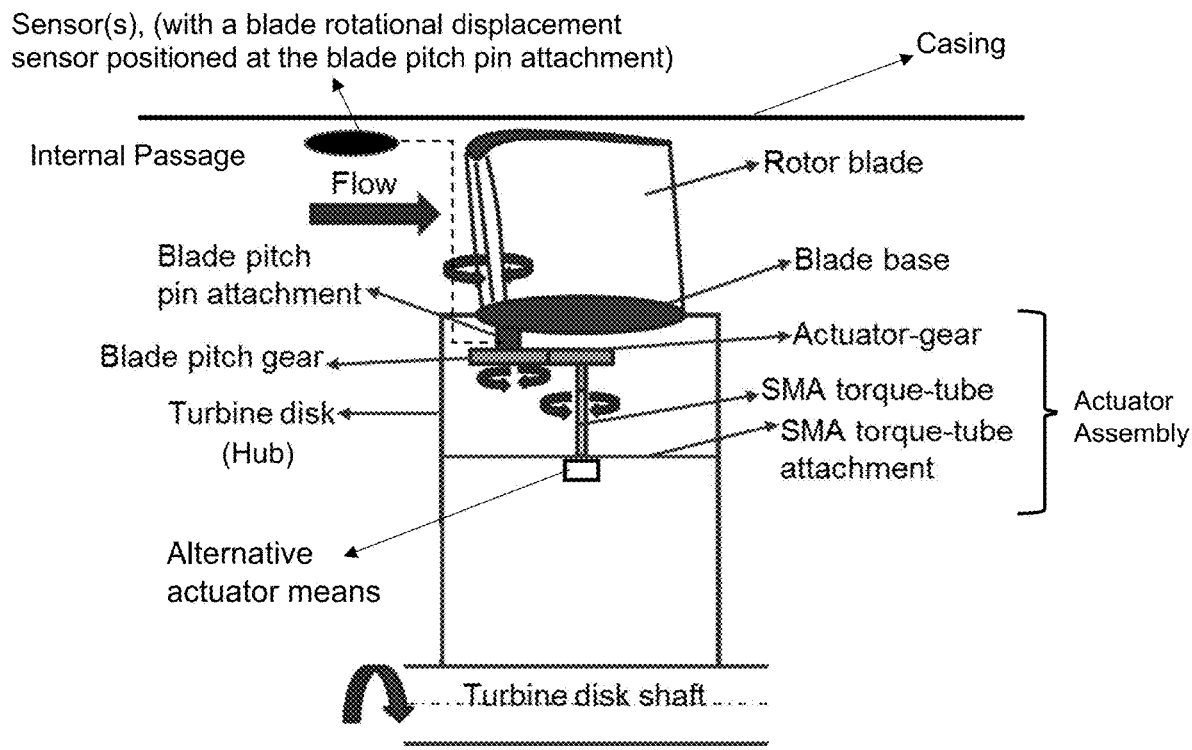
FIG. 13 shows blade articulation design mechanism for a turbine rotor blade using SMA torque tube actuation in accordance with an embodiment of the present invention.

FIG. 13 illustrates a blade articulation mechanism for a turbine rotor blade that is housed inside a hollow turbine disk according to an embodiment of the invention. The articulation mechanism assembly is structurally attached through bolts or fasteners to the circular disk, called "SMA torque-tube attachment" in the FIG. 13. The whole articulation assembly is housed inside the hollow cavity within the turbine disk as shown in FIG. 13.

The direction of airflow is depicted by the arrow labelled "Flow." Its direction with respect to the blade is subject to constant change. The rotor blade can be any conventional design used for rotor/stator blades and vanes. The blade geometric angle is the blade angle. This is a fixed value (constant) by design. The inlet flow angle minus the blade geometric angle gives the incidence angle, i. The incidence angle is equal to 0 deg. for optimum performance with least loss coefficient.

Ainley, D. G., and Mathieson, G. C. R., "An examination of the Flow and Pressure Losses in Blade Rows of Axial-Flow Turbine", Aeronautical Research Council Technical Report, R & M No. 2891, 1955) (figure shown in slide#6 of TETS 2016 presentation) describes "Profile loss" in a turbine blade row or cascade as the pressure loss due to skin friction or separation which will take place with a uniform two-dimensional flow across a cascade of blades. For fixed axial-flow turbine blade geometry, this plot shows the variation of relative profile loss coefficient $[Y_P]/[Y_P(i=0)]$ with respect to relative incidence ($i/i_s$) as follows. In the plot, $[Y_P]$ denotes profile loss at incidence i, $[Y_P (i=0)]$ denotes profile loss at incidence=0, i denotes incidence angle, $i_s$ denotes stalling incidence angle. From this plot, it is evident that the allowable incidence variation is limited to have reduced profile loss in an axial-flow turbine cascade.

Accordingly, the actuator assembly is configured to adjust the pitch of the blades. While only a single blade is shown in FIG. 13, it will be appreciated that a plurality of such blades are positioned radially around the turbine disk as further depicted in FIG. 14. Since both the actuators and mechanisms are preferably housed inside the turbine disk (blisk hub region), space and packaging can be a design challenge. The turbine disk rotates around the turbine disk shaft. The shaft rotations at high speed, typically around approximately 45,000 rpm, for instance, for a GE T-700 gas turbine engine. Weight/balancing is always an issue for existing (current) turbine designs. The mass of all parts assembled should be well-balanced since given the very high rotational. To this end, the actuators can be judiciously positioned to provide radial symmetry around the turbine shaft.

The turbine disk includes a hollow region which houses the actuator assemblies. In a typical turbine, such as the GE T-700 turbine, the following are typical dimensions of the region available for containing/supporting the actuators:

| | |
|---|---:|
| Turbine Shaft diameter: | 4.0 cm |
| Turbine blisk base (Blade root/base) diameter: | 15.4 cm |
| Turbine blisk thickness: | 3.0 cm |

The design packaging region for containing/supporting the actuators/mechanisms: A housing ring of inner radius—2 cm, outer radius—7.7 cm and thickness of 3 cm. By using advanced high strength high temperature materials, and hollow turbine disk design, the actuators and mechanism can be sized small enough by be housed inside the blisk hub region.

The blade base connects to the turbine disk. The blade pitch pin attachment is a shaft or pin for articulating the blade. The attachment pin may be 5 mm length and 5 mm dia., for example. It can be welded or keyed with a lock to the blade base (interference fit—similar to a keyed shaft), for example. The expected blade articulation using SMA torque-tube device is about ±15 deg. about its design position. This value is just an example and may vary depending on the blade design available design space limits for the given blade passage.

The SMA torque tube is a cylindrical hollow tube of desired dimensions. In one embodiment, the SMA torque tube may be 50 mm in length, with a 2 mm inner diameter and an 8 mm outer diameter, for example. The SMA torque tube's bottom end is attached to a circular ring platform inside the turbine disk. It is not attached to the turbine disk shaft. However, the turbine disk is spinning with each SMA torque tube for each blade housed inside. The bottom-end of each SMA torque tube is fixed onto the base attachment (SMA torque-tube attachment) similar as shown in FIG. 6. The SMA smart material is provided electrical power for actuation. The electrical wiring harness and power supply to the rotating SMA torque tube assembly housed inside the rotor disk can be supplied through wireless means or through wireless contact brush/brushes.

During actuation (through electrical current input) the top end of SMA torque-tube undergoes twisting in either direction turning the actuator-gear clock-wise or anti-clockwise. This rotation (turning—not full rotation) can be increased/decreased for twist/torque through the blade pitch gear (if needed) to turn the pin attached to the base of the blade. The gears of the gear set may be spur gears, as shown, for example. However, it will be appreciated that the set of gears may include various other types of gears, such as helical, bevel, hypoid, worm, harmonic or the like.

The SMA torque tube drives an actuator-gear which in turn drives a blade pitch-gear. The circular disk shaped base of the turbine rotor blade is rotated as needed to change the incidence angle with the incoming gas flow. The exemplary diameter sizes for the gears may be blade: pitch gear—12 mm dia.; actuator gear—8 mm dia. This would give a gear ratio of approximately 1.5. The aforementioned dimensions are just examples for a typical gas turbine engine (rotorcraft gas turbine engine) and it should be appreciated that these dimensions are scalable depending on the engine size design.

Figure 14:
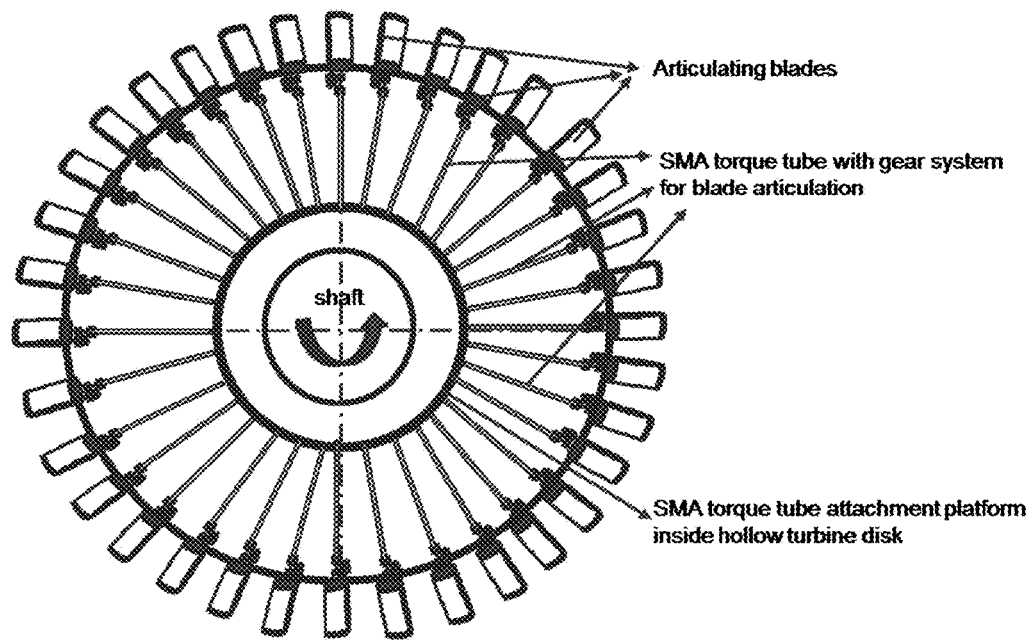
FIG. 14 is a sketch showing articulation mechanisms housed inside hollow turbine rotor disk for blades in accordance with an embodiment of the present invention.

FIG. 14 shows the arrangement of articulation mechanisms for all blades inside a hollow turbine rotor disk according to an embodiment. Inside this hollow disk environment, where all articulation mechanisms are located, the temperature can be controlled (if needed for SMA torque tubes) by using bleed air from the compressor section of the engine. The temperature inside can be brought to about 450 deg. C. so that the current technology SMA material can survive in this temperature environment. There is a system currently available for the GE T-700 which uses bleed air from the compressor for turbine blade cooling. The same bleed air system can be tapped for cooling the articulation mechanism inside the turbine disk.

In this embodiment, there is one actuator (e.g., a SMA torque tube) provided for each of the rotor blades.

Newer advanced SMA materials which are under research and development show potential to survive up to approximately 800 deg C. by addition of Hf (Hafnium) or Pd (Palladium) or Pt (Platinum) to NiTi (Nickel-Titanium) Shape Memory Alloy (SMA). But, the other SMA materials could also be used.

A flow velocity and/or direction sensor positioned suitably at the inlet of turbine stage together with a blade rotational displacement sensor (positioned at the blade pitch pin attachment shown in FIG. 13) can be used to have a feed-back control algorithm for efficient control of blade articulation. Using the sensors and feedback control algorithm, the rotor blade can be oriented and adjusted to remain at the optimum position dynamically during engine operation for the efficient performance of the engine at different operating conditions.

The optimum position is where the measured flow angle coincides with airfoil (blade) geometric angle resulting in incidence angle=0 deg. In a rotating (rotor) blade passage, relative flow velocity is used to assess aerodynamic performance. Hence relative incidence angle is difference between relative inlet velocity (to the rotor blade passage) and rotor blade geometric angle at rotor inlet.

Figure 15:
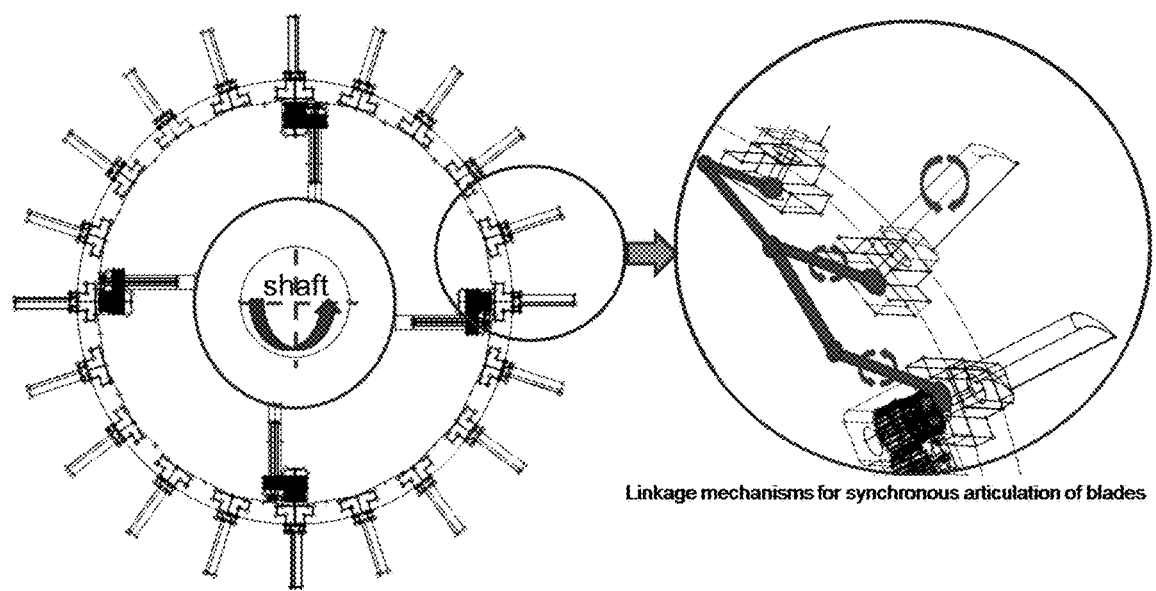
FIG. 15 is a sketch showing alternative design with four SMA torque tubes and linkages for synchronous articulation of rotor blades in accordance with an embodiment of the present invention.

FIG. 15 shows an embodiment of turbine having high-torque capable SMA torque tubes and a set of linkage mechanisms to pitch all blades synchronously. This is similar to the embodiment shown in FIG. 14, except that the exemplary design shown in FIG. 15 uses less SMA torque tubes than the number of blades, which results in a design option that may have less overall mass and less packaging design space needed. The exemplary turbine depicted in FIG. 15 includes 20 blades. Four actuators are provided, one for groups of five blades which are connected by a mechanical linkage assembly. The SMA actuators are powered by electrical power supplied through wireless means or through wiring harness and contact brushes to transfer power from stationary part to the rotating part. The linkage assemblies enable synchronous articulation of the blades. As shown in FIG. 15, the linkages may include a three bar pitman(s) mechanism connected by suitable pivot elements (such as bushings, sleeves, or bearings) to transfer similar rotations (articulations) through a combination of translations and rotations from the blade powered by SMA torque tube to all the connected blades. In this way, the linkages act similar to a pantograph duplicating the same motion from one member to the others.

Figure 16:
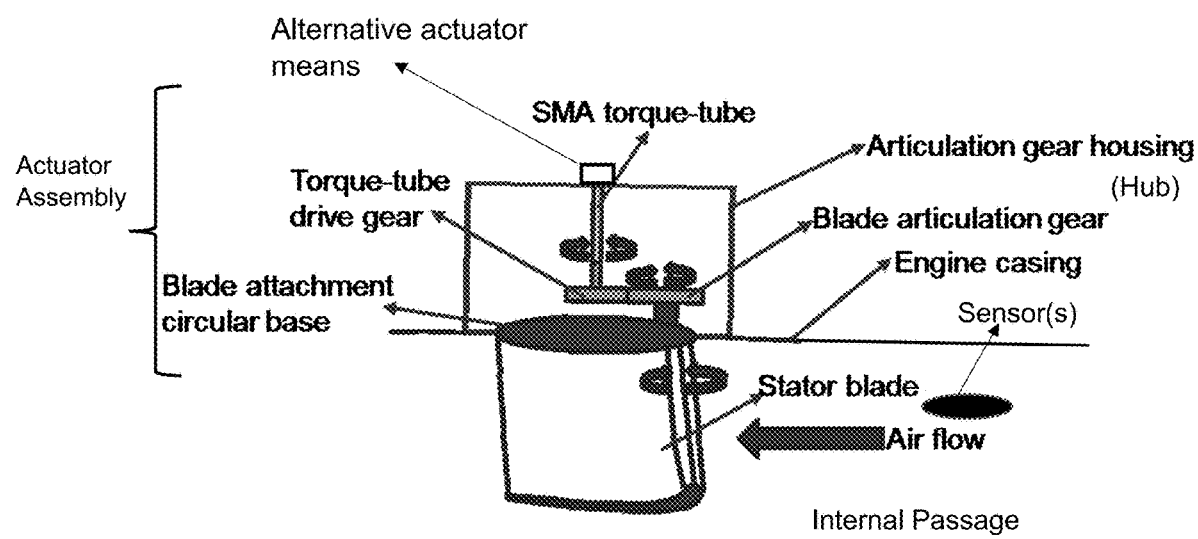
FIG. 16 shows an articulation mechanism for a turbine stator blade using SMA torque tube actuation in accordance with an embodiment of the present invention.

FIG. 16 illustrates the turbine stator blade articulation mechanism embodiment that can be housed on the engine casing according to an embodiment. This embodiment is very similar to the rotor blade actuation mechanism shown in FIG. 13. It also uses SMA torque tube and set of two gears. Similar sensor based controls and ratcheting base can be used to fix the stator vane at the desired position dynamically for optimizing the performance at various operating conditions. However, in FIG. 16 the blade shown is a stator blade and it is stationary. The blade with its articulation mechanism (FIG. 16) is housed on top of the engine casing. The complete articulation mechanism assembly with its housing structure is bolted or fastened to the engine casing and is positioned as a circular ring structure externally as shown in FIG. 16. The stator blade in this case is articulated synchronously with the downstream rotor blade (shown in FIG. 13) to improve the off-design performance of the engine in the most optimum way.

With respect to FIGS. 13 and 16, a Shape Memory Alloy (SMA) torque tube is described as an actuator. It will be appreciated that in other embodiments, instead of the SMA torque tube, various other actuators may be used, such as an electro-mechanical actuator, a hydraulic-mechanical actuator, a microelectromechanical systems (MEMS) based actuator, a magnetic/electro-magnetic material based actuator, or a piezo-electric material based actuator. These alternatives are nominally labelled as "Alternative actuator means" in those drawings.

Figure 17:
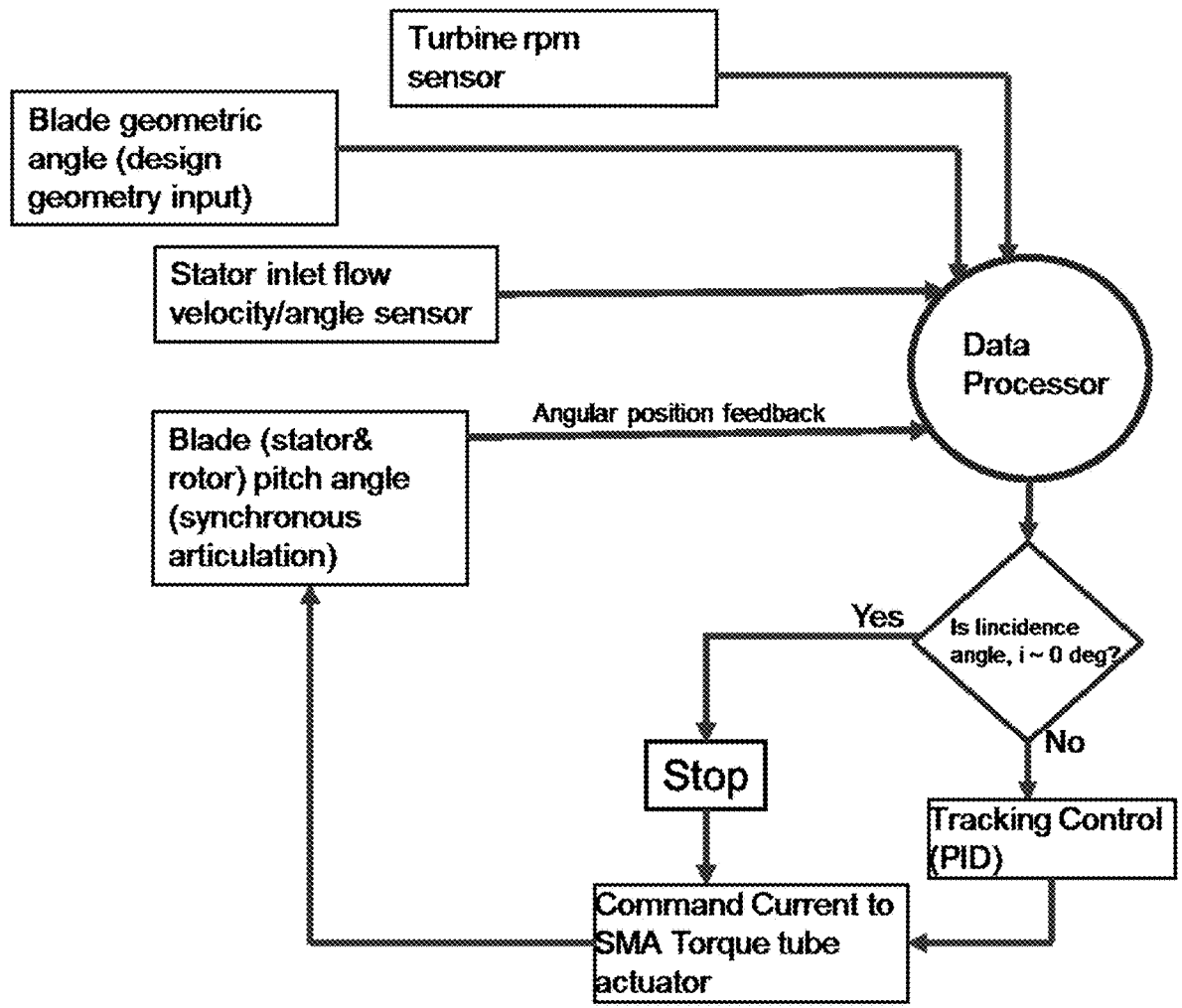
FIG. 17 shows a control system architecture in accordance with an embodiment of the present invention.

FIG. 17 depicts an exemplary control system architecture which can be used to control the articulation of stator and rotor blades synchronously according to embodiments. It will be a feedback control system with the sensors (i.e., turbine rpm sensor, stator inlet flow velocity (with direction) sensor, blade angular position sensor, and blade geometric angle inputs (for a given design)) as shown in the flow chart above. Any suitable processor, micro-processor, or computing system may be used. The control section may be a proportional-integral-derivative controller (PID controller) which uses a control loop feedback, for instance. Of course, other types of controller may be used.

While independent and separate control of the stator and rotor blades is possible, synchronous articulation control of both stator and rotor blades may be preferable (in many instances) since this provides wider margin of control to effectively influence improved performance of each stage (here, the stage includes both the stator and the rotor).

The turbine rotating (rpm) sensor is a conventional sensor for a turbine engine. It can be located anywhere on the turbine shaft. The rpm sensor types can be optical or Hall effect or brushless motor, for instance. The Hall effect or optical sensors can have good accuracy for use in a control system. The inlet flow velocity and angle sensors can be located at inlet to stator blade and at inlet to the rotor blade. Select sensors should be able to withstand the engine environment. The current is proportional to torque or twist of the SMA torque-tube. This relationship (whatever it may be) can be programmed into the controller logic within desired range of operation.

Figure 18:
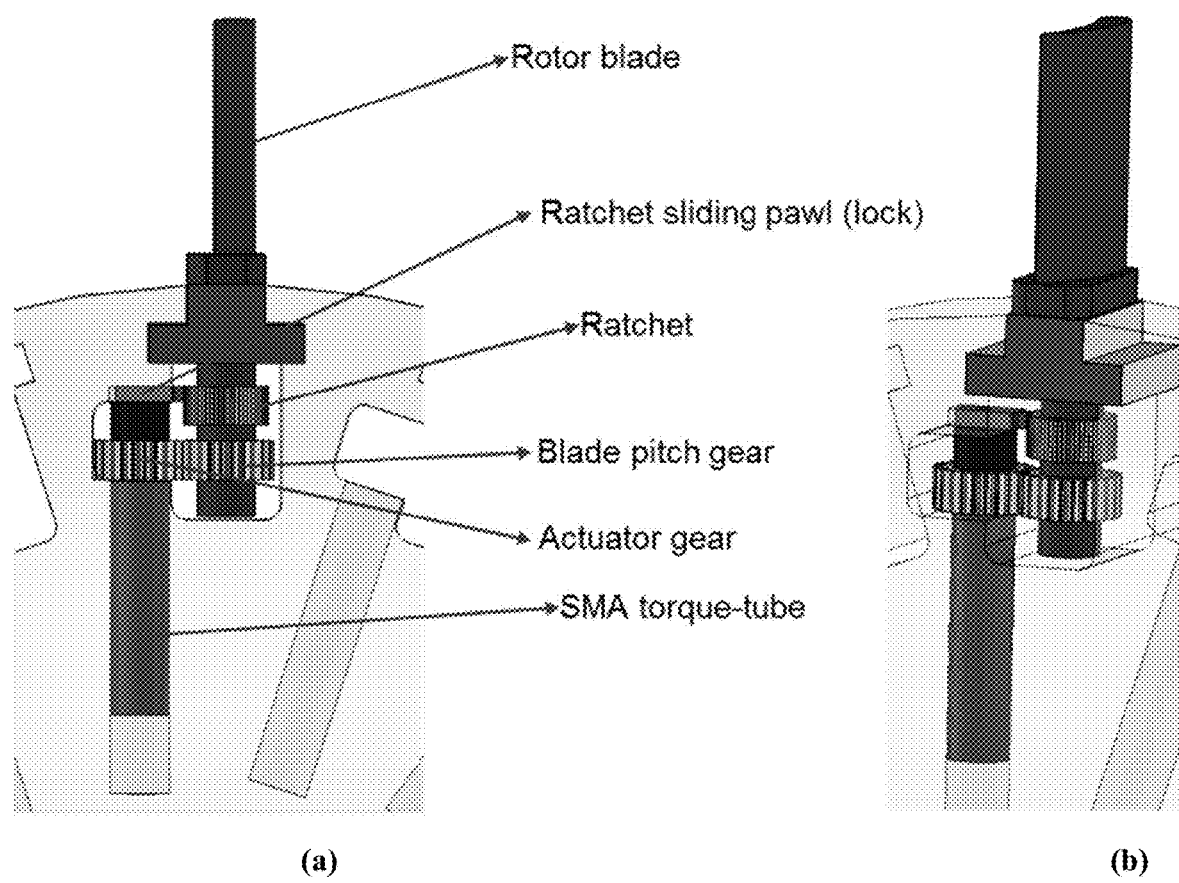
FIG. 18 shows a ratchet and pawl mechanism for blade bi-directional articulation in accordance with an embodiment of the present invention.

FIG. 18 shows a ratcheting type of base-disk will be used for each blade to fix the blade angle orientation after articulation of the blade to the desired position according to embodiments. FIG. 18(a) is a side view and FIG. 18(b) is an isometric view showing the same structure. The ratcheting mechanism is comprised of a sliding pawl and a ratchet. It can be used for blade articulation in both directions and locking it in place after reaching desired position using the sliding pawl (to achieve blade angle and flow angle alignment with incidence angle, i 0 deg).

Figure 19A:
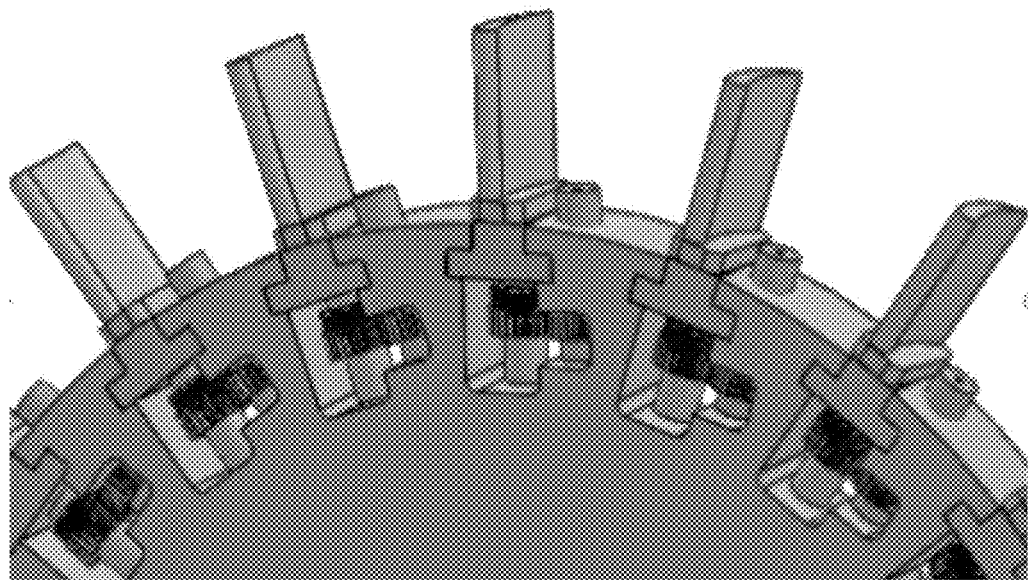
FIGS. 19(a) through 19(c) are still frames of animation showing blade pitch adjustment in accordance with an embodiment of the present invention.
Figure 19B:
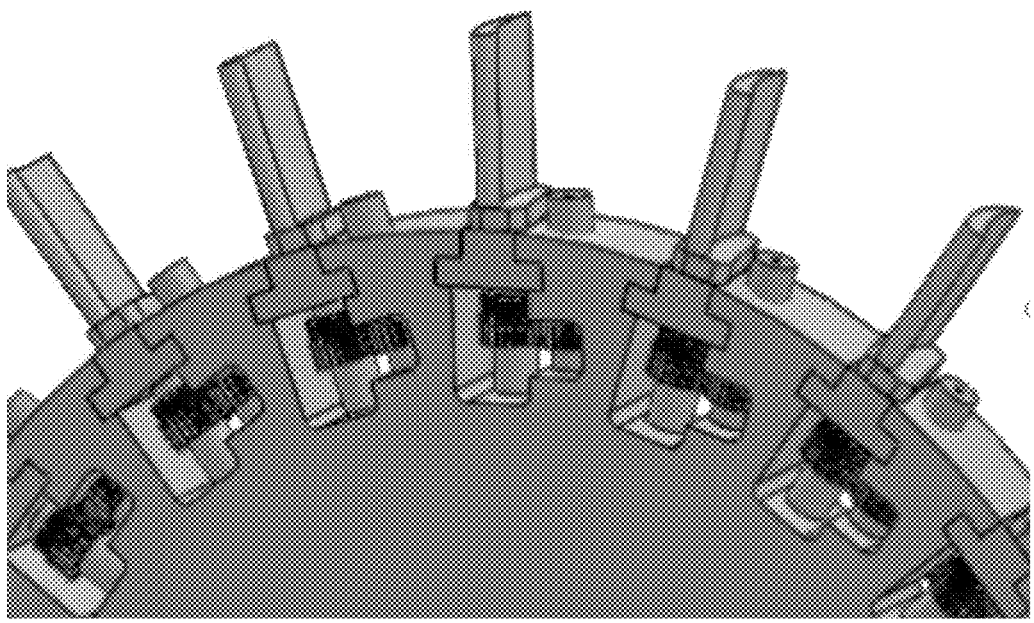
Figure 19C:
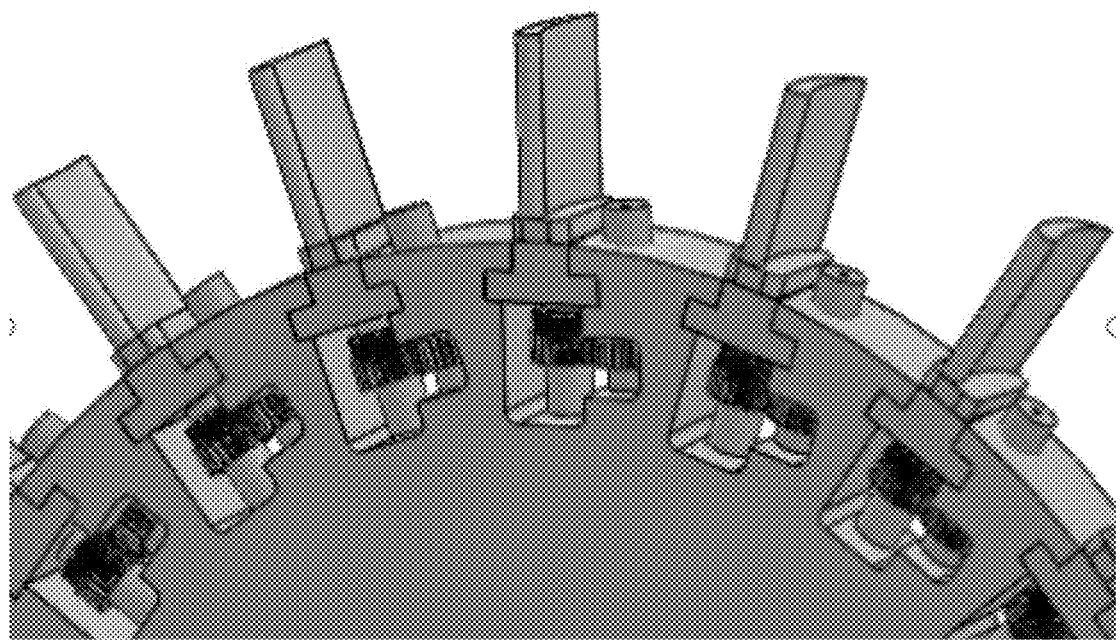

The inventors put together an animation showing pitch adjustment. FIGS. 19(a) through 19(c) show three still pictures with different articulated settings of the blades.

This patent disclosure provides a conceptual assessment of the benefit and feasibility of an adaptable variable pitch turbine blade for maintaining high aerodynamic performance and optimal thermal design for gas turbine engines operating at part-load conditions. Embodiments for various exemplary articulation mechanisms have been shown. Various smart materials have been reviewed for blade articulation application. The possibility of using high temperature capable NiTi SMAs have been reviewed as well. Existing challenges in using NiTi SMAs for high temperature application have been noted.

Preliminary 3D CFD results of stator-rotor interaction in a turbine stage under off design condition are provided. These results show that by articulating the rotor blades, according to embodiment, we are able to recover a more optimal flow field under certain rotor inlet conditions. Articulating the turbine blades can achieve high performance of gas turbine under off-design conditions.

Detailed aerodynamic experimental and computational investigations are planned to determine the range of angular rotations needed to articulate the blades with respect to the nominal design blade angle settings for a turbine stage. Simultaneously, promising high temperature capable SMAs and piezo-electric based smart actuators will be investigated in depth for blade articulation application. Additional future work will be needed to do more detailed computational modeling and analysis of the increased hub and shroud losses caused by the clearance between the articulated blades/vanes and the hub/shroud and design of geometries that minimize these clearance effects (lessons learned from compressor variable guide vanes could be applied). This clearance effect will have to be quantified and assessed as to how much it counteracts the benefits of the articulated airfoils.

The expected payoffs post transition to a higher are:
1. Adaptive gas turbine blade technology insertion for optimized engine performance.
2. Mitigate Engine Stall and flow separation in candidate future Variable Speed Turbine for Future Vertical Lift aircraft.
3. More efficient power generation (Power Turbine for a turboshaft engine).

While the present invention has been illustrated by the description of embodiments, and while the embodiments have been described in detail, it is not intended to restrict the scope of the appended claims to these details. Additional advantages and modifications will readily appear to those skilled in the art. The specification should be considered exemplary only, and the scope of the invention is intended to be limited only by the following claims.

All references mentioned above are incorporated by reference in their entireties herein.

We claim:

1. An articulating blade assembly comprising:
a casing defining an internal passage for fluid flow;
a hub;
a plurality of articulating blades arranged around the hub in the internal passage;
one or more actuators, each of the one or more actuators positioned within a cylindrical cavity in the hub and configured to rotate about an axis extending radially from the hub; and
an actuator assembly operatively connected to each of the plurality of articulating blades and comprising:
an articulating pin attached to a base of the blade; and
a set of gears operatively connecting the articulation pin to one of the one or more actuators positioned in the hub; and
one or more sensors comprising at least a blade angular position sensor which measures an inlet fluid angle of the blades; and
a microprocessor, connected to the one or more sensors, configured to receive inlet fluid angle measurements of the blades and control the one or more actuators such that the plurality of articulating blades are rotated to have an optimum incidence angle with respect to the fluid flow in the internal passage for operation.

2. The articulating blade assembly of claim 1, wherein the set of gears comprise: a first gear attached to the articulating pin; and a second gear operatively connected to the one of the one or more actuators engaging the first gear.

3. The articulating blade assembly of claim 1, wherein one actuator is provided for each blade.

4. The articulating blade assembly of claim 1, wherein the one or more actuators comprise at least two actuators and there are fewer actuators than the plurality of articulating blades, with at least one actuator controlling a subset of the plurality of blades, and the actuator assembly further comprises at least one linkage assembly configured to enable synchronous articulation of the subset of the plurality of articulating blades with the one or more actuators.

5. The articulating blade assembly of claim 4, wherein the set of gears and the at least one linkage are configured to synchronously articulate all blades in the subset together.

6. The articulating blade assembly of claim 1, further comprising: a turbine rotation sensor, an inlet flow velocity and direction sensor, a blade geometric angle input sensor, or any combination thereof.

7. The articulating blade assembly of claim 1, wherein the plurality of articulating blades comprise stators, rotors, vanes, or any combination thereof.

8. The articulating blade assembly of claim 1, where the actuator assembly further comprises:
a pawl and ratchet configured to position and hold one of the plurality of articulating blades at a particular angular orientation.

9. The articulating blade assembly of claim 1, wherein the hub comprises a hollow turbine or compressor disk.

10. The articulating blade assembly of claim 1, wherein the microprocessor is configured to execute a feedback control routine.

11. The articulating blade assembly of claim 1, wherein the one or more actuators comprises: a Shape Memory Alloy (SMA) torque tube, an electro-mechanical actuator, a hydraulic-mechanical actuator, a microelectromechanical systems (MEMS) based actuator, a magnetic/electro-magnetic material based actuator, or a piezo-electric material based actuator.

12. The articulating blade assembly of claim 1, wherein the microprocessor is configured to maintain the plurality of articulating blades at an incidence angle of 0 degrees with respect to a direction of the inlet fluid flow in response to changing operational conditions, where the incidence angle is defined as the inlet fluid flow angle minus the blade angle.

13. The articulating blade assembly of claim 1, wherein the one or more actuators is formed of SMA comprising Pd, Pt, Au, Hf, and Zr added to a NiTi alloy.

14. A turbine engine comprising the articulating blade assembly of claim 1.

15. The articulating blade assembly of claim 1, wherein the one or more sensors comprises: an inlet flow velocity and direction sensor.

16. The articulating blade assembly of claim 1, wherein, in each of the actuator assemblies, the articulating pin is positioned within another cylindrical cavity in the hub and configured to rotate about another axis extending radially from the hub.

17. The articulating blade assembly of claim 16, wherein, in each of the actuator assemblies, the set of gears convert rotation about the radial axis of the one or more actuators to rotation about the other radial axis of the articulation pin.

18. The articulating blade assembly of claim 1, wherein the hub is located in the casing.

19. The articulating blade assembly of claim 1, wherein each of the one or more actuators is positioned within a separate cylindrical cavity of the hub.

20. The articulating blade assembly of claim 17, wherein each of the actuator assemblies is positioned within a separate cylindrical cavity of the hub.

* * * * *